United States Patent
Hu et al.

(10) Patent No.: US 9,514,989 B2
(45) Date of Patent: Dec. 6, 2016

(54) GUARD RINGS INCLUDING SEMICONDUCTOR FINS AND REGROWN REGION

(71) Applicant: Taiwan Semiconductor Manufacturing Company, Ltd., Hsin-Chu (TW)

(72) Inventors: Chia-Hsin Hu, Changhua (TW); Min-Chang Liang, Zhu-Dong Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/719,586

(22) Filed: May 22, 2015

(65) Prior Publication Data

US 2015/0255351 A1    Sep. 10, 2015

Related U.S. Application Data

(62) Division of application No. 14/166,510, filed on Jan. 28, 2014, now Pat. No. 9,053,947, which is a division of application No. 13/644,261, filed on Oct. 4, 2012, now Pat. No. 8,723,225.

(51) Int. Cl.

| H01L 21/84 | (2006.01) |
|---|---|
| H01L 21/8234 | (2006.01) |
| H01L 29/06 | (2006.01) |
| H01L 27/088 | (2006.01) |
| H01L 21/762 | (2006.01) |
| H01L 29/417 | (2006.01) |
| H01L 29/66 | (2006.01) |
| H01L 29/78 | (2006.01) |
| H01L 23/485 | (2006.01) |

(52) U.S. Cl.
CPC . *H01L 21/823431* (2013.01); *H01L 21/76224* (2013.01); *H01L 21/823481* (2013.01); *H01L 27/0886* (2013.01); *H01L 29/0619* (2013.01); *H01L 29/41791* (2013.01); *H01L 29/66795* (2013.01); *H01L 29/785* (2013.01); *H01L 23/485* (2013.01); *H01L 2924/0002* (2013.01)

(58) Field of Classification Search
CPC .......................... H01L 29/785; H01L 21/0886
USPC ................ 438/197–198, 281–283, 290, 467, 156,438/173
See application file for complete search history.

(56) References Cited

U.S. PATENT DOCUMENTS

| 7,309,626 B2 | 12/2007 | Ieong et al. |
| 7,964,893 B2 | 6/2011 | Lee |
| 8,154,089 B2 | 4/2012 | Ohguro |
| 8,263,451 B2 * | 9/2012 | Su .......................... H01L 29/785 257/190 |

(Continued)

FOREIGN PATENT DOCUMENTS

| JP | 2007142392 | 6/2007 |
| JP | 2009130036 | 6/2009 |

*Primary Examiner* — Dung Le
(74) *Attorney, Agent, or Firm* — Slater Matsil, LLP (57) ABSTRACT

A method includes forming a semiconductor fin, which forms a ring, forming a plurality of gate stacks on sidewalls and a top surface of each of sides of the ring, epitaxially growing a plurality of epitaxy regions between the plurality of gate stacks, and forming a plurality of metal contact plugs. Each of the plurality of metal contact plugs is over, and is electrically coupling to, one of the plurality of epitaxy regions.

20 Claims, 10 Drawing Sheets

(56) References Cited

U.S. PATENT DOCUMENTS

| | | |
|---|---|---|
| 2008/0242024 A1 | 10/2008 | Sugioka |
| 2009/0127625 A1 | 5/2009 | Ohguro |
| 2012/0012932 A1 | 1/2012 | Perng et al. |
| 2013/0026571 A1 | 1/2013 | Kawa et al. |
| 2013/0230965 A1 | 9/2013 | Sudo |
| 2014/0179070 A1 | 6/2014 | Yang |

* cited by examiner

GUARD RINGS INCLUDING SEMICONDUCTOR FINS AND REGROWN REGION

PRIORITY CLAIM AND CROSS-REFERENCE

This application is a divisional of U.S. patent application Ser. No. 14/166,510 entitled "Methods for Forming Guard Rings on Fin Structures," filed Jan. 28, 2014, now U.S. Pat. No. 9,053,947, which application is a divisional of U.S. patent application Ser. No. 13/644,261, entitled "Guard Rings on Fin Structures," filed on Oct. 4, 2012, now U.S. Pat. No. 8,723,225, which applications are incorporated herein by reference.

BACKGROUND

Guard rings are formed in integrated circuits as isolation regions of devices. Conventional guard rings may include semiconductor regions surrounding the circuit devices. The guard rings may be connected to power supply voltages VDD, or may be grounded.

In the integrated circuits that adopt Fin Field-Effect Transistors (FinFETs), the guard rings may also adopt fin shapes. For example, the formation of some guard rings includes etching silicon fins to form recesses, and epitaxially growing silicon germanium in the recesses. The grown silicon germanium forms the guard ring. Since the guard rings are typically long, non-uniformity occurs in the growth of silicon germanium. As a result, some portions of the grown silicon germanium may have thicknesses significantly smaller than other portions. Furthermore, the surfaces of the grown silicon germanium may be rough. This results in a high resistance in the grown silicon germanium and poor landing of contact plugs.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 6A are cross-sectional views and a top view of intermediate stages in the manufacturing of a guard ring in accordance with some exemplary embodiments;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A guard ring and the method of forming the same are provided in accordance with various exemplary embodiments. The intermediate stages of forming the guard ring are illustrated. The variations and the operation of the embodiments are discussed. Throughout the various views and illustrative embodiments, like reference numbers are used to designate like elements.

Figure 1A:
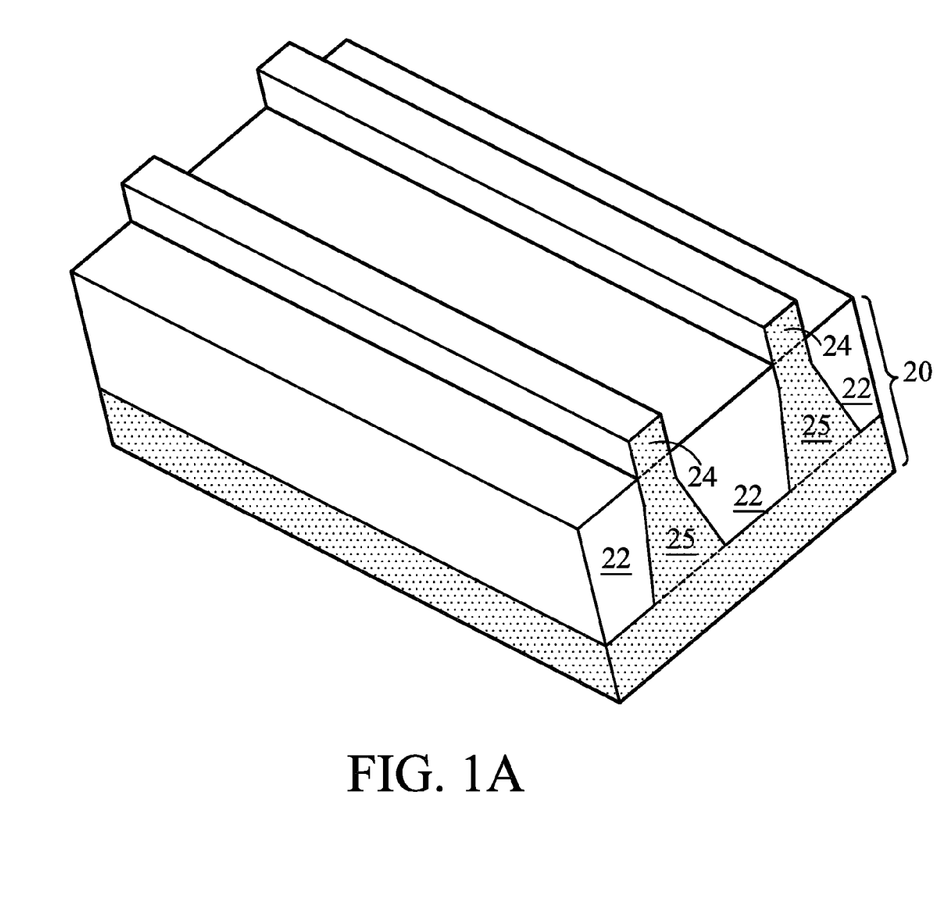
Figure 1B:
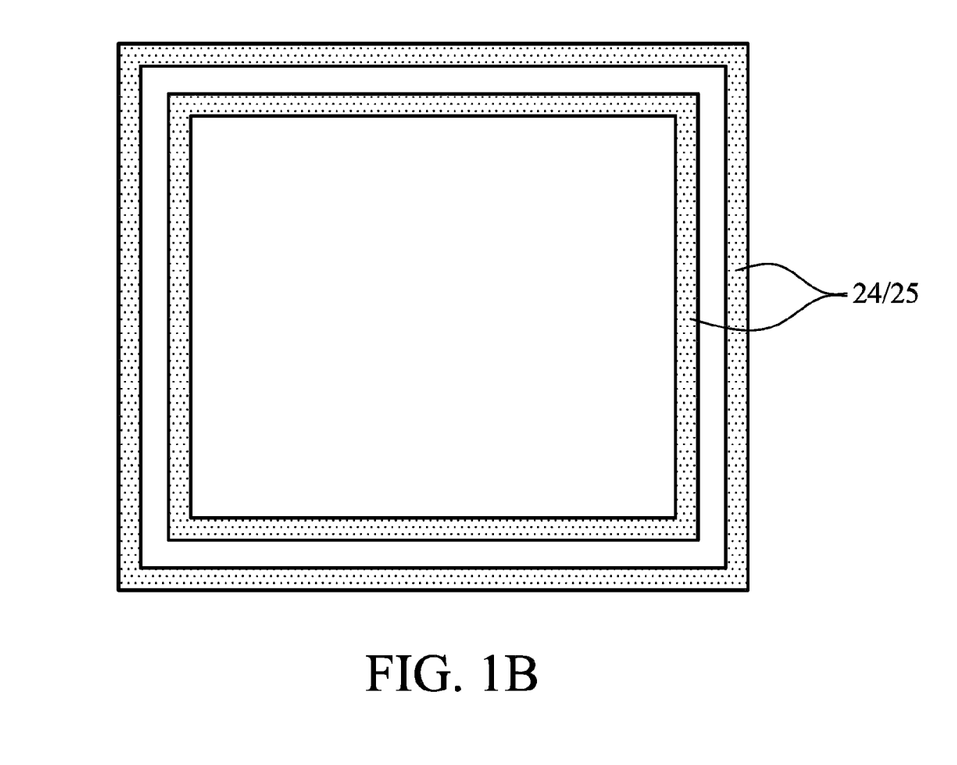

Referring to FIG. 1A, an integrated circuit structure is formed. The integrated circuit structure includes substrate 20, which may be a bulk semiconductor substrate or a Semiconductor-on-Insulator (SOI) substrate. Substrate 20 may be lightly doped with a p-type or an n-type impurity. Isolation regions such as Shallow Trench Isolation (STI) regions 22 may be formed in substrate 20, and may extend from the top surface of substrate 20 into substrate 20. Fins 24 are formed over the top surfaces of STI regions 22. Fin 24 may be formed by removing top portions of STI regions 22, so that the portions of semiconductor material between neighboring STI regions 22 becomes fins 24. FIG. 1A also illustrates semiconductor strips 25 between STI regions 22. Semiconductor strips 25 and fins 24 may be formed of a same semiconductor material such as silicon. Furthermore, semiconductor strips 25 may a portion of substrate 20, and may be formed of a same material as the bulk substrate portion of substrate 20, which bulk substrate portion is underlying STI regions 22. In some embodiments, each of semiconductor strips 25 and fins 24 forms a ring, as shown in FIG. 1B.

Figure 2:
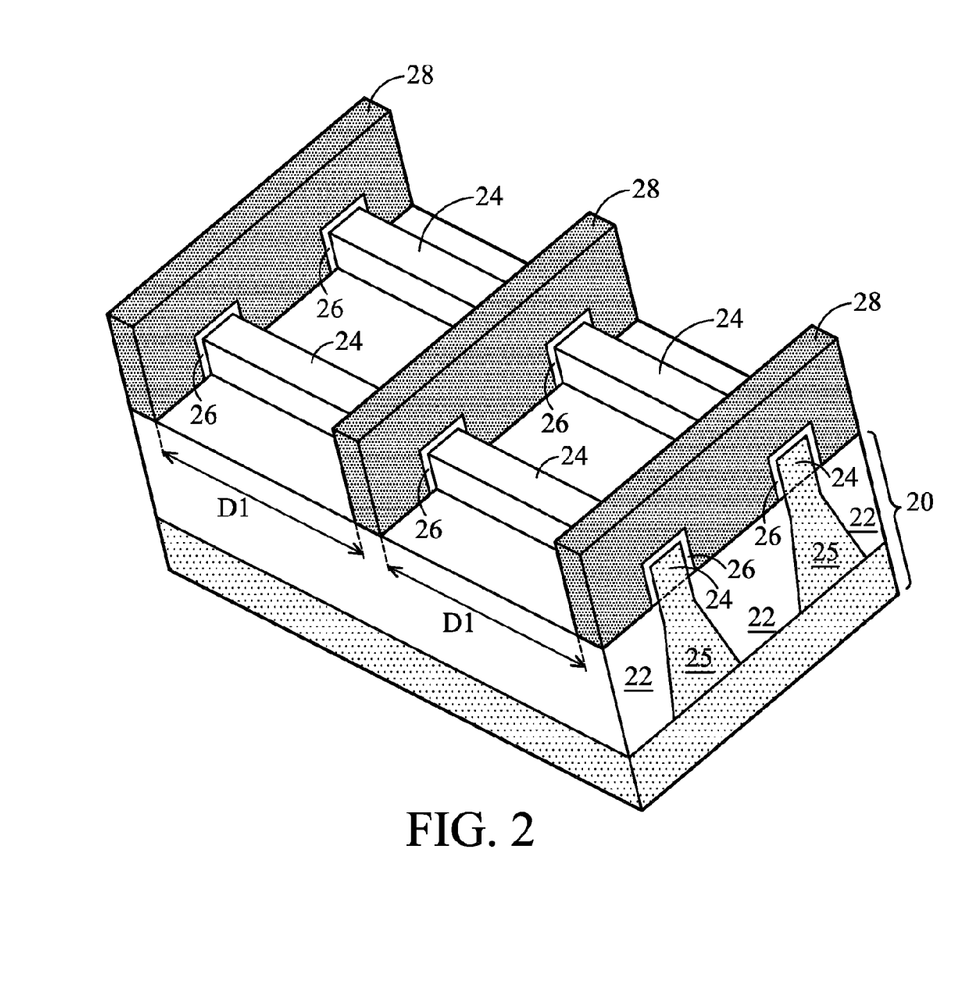

Referring to FIG. 2, a plurality of gate stacks are formed, each including one of gate dielectrics 26 and one of gate electrodes 28. Gate dielectrics 26, which may be formed of silicon oxide, silicon nitride, silicon oxynitride, a high-k dielectric material, or the like, are formed on the top surfaces and sidewalls of fin 24. Gate electrodes 28 are formed over gate dielectrics 26. Gate electrodes 28 may be formed of a conductive material such as polysilicon, a metal, a metal alloy, a metal silicide, or the like. In the embodiments wherein gate electrodes 28 are formed of polysilicon, hard masks such as silicon nitride layers may be formed over each of gate electrodes 28. Although not illustrated in FIG. 2, gate spacers 29, which are shown in FIGS. 6B and 6C, are also formed on the opposite sidewalls of gate electrodes 28. In some embodiments, distances D1 between neighboring gate electrodes 28 are smaller than about 0.2 μm, and may be between about 0.05 μm and about 0.2 μm, although a greater or a smaller distance may be used. It is appreciated, however, that the dimensions recited throughout the description are merely examples, and may be changed to different values.

Figure 7:
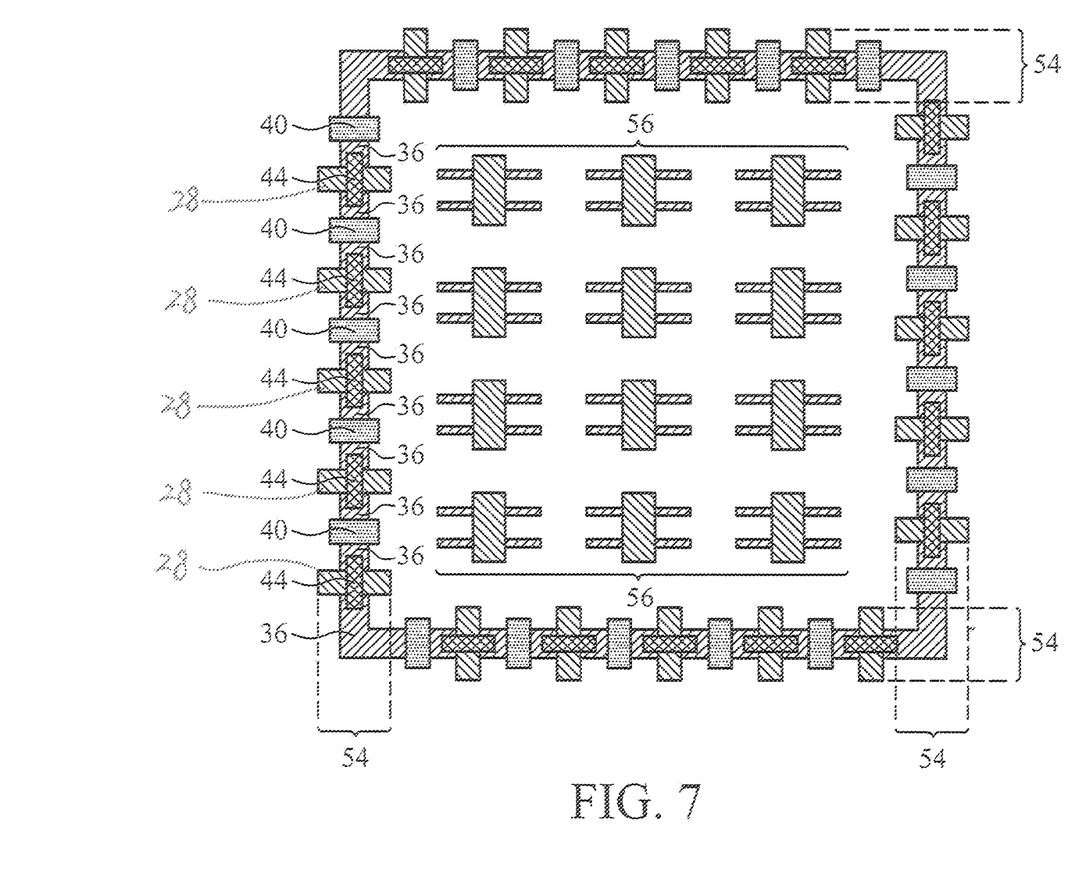
FIG. 7 illustrates an exemplary guard ring in accordance with exemplary embodiments, wherein the structure in FIGS. 6A-6C is a part of the guard ring.

Only three gate stacks are illustrated in the illustrated embodiments for clarity. In the embodiments, however, there may actually be many gate stacks distributed throughout the semiconductor ring of fin 24, which gate stacks are shown in FIG. 7. The distances D1 between neighboring gate stacks are also controlled not to exceed the desirable range.

Figure 3:
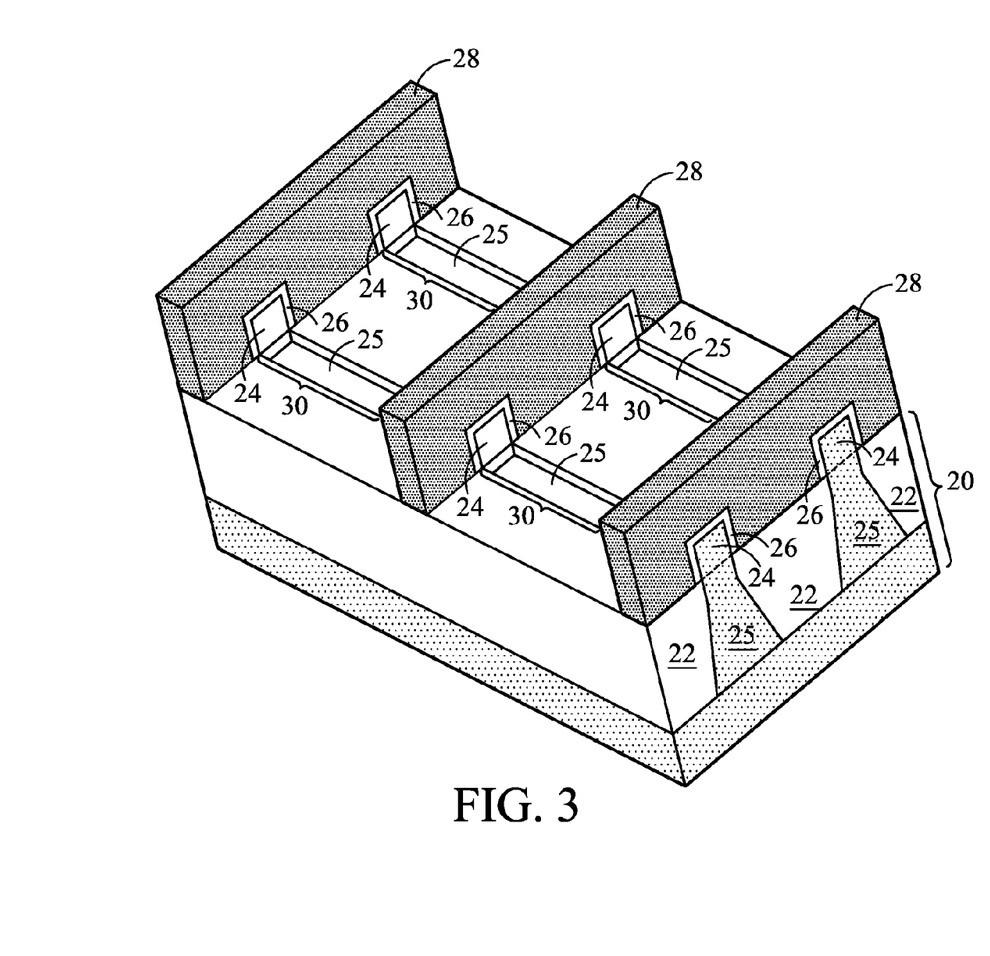

Referring to FIG. 3, the exposed portions of fins 24 not covered by gate dielectrics 26, gate electrodes 28, and gate spacers 29 (FIGS. 6B and 6C) are removed (recessed), while the covered portions of fins 24 are not removed. The removal may be performed through a dry etch step. The spaces left by the removed portions of fins 24 are referred to as recesses 30 hereinafter. Recesses 30 may have bottoms lower than the top surfaces of STI regions 22. As a result, portions of semiconductor strips 25 are also removed, and the top surfaces of the remaining semiconductor strips 25 are exposed. In alternative embodiments, the bottoms of recesses 30 are lower than the top surfaces of STI regions 22.

Figure 4:
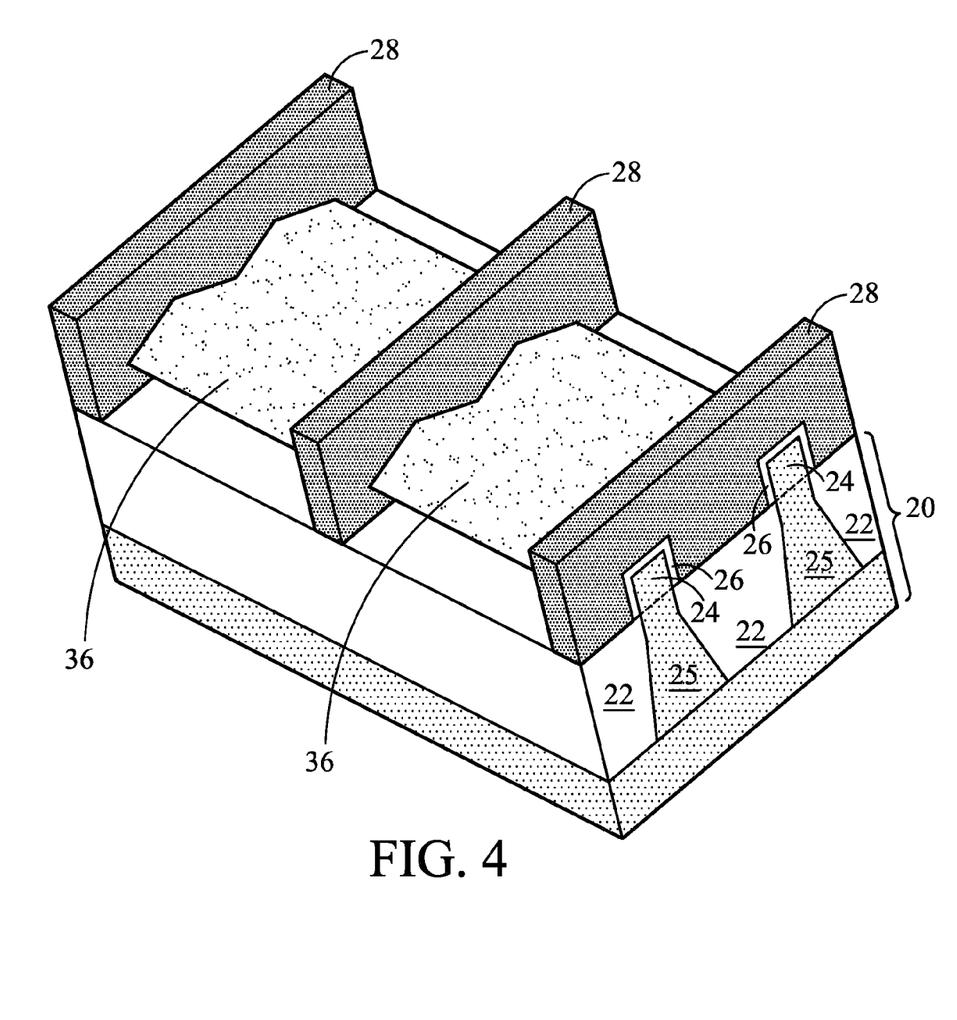

Next, as shown in FIG. 4, epitaxy semiconductor regions 36 are grown from recesses 30 in FIG. 3 through epitaxy. Epitaxy semiconductor regions 36 have a lattice constant different from the lattice constant of fins 24 (FIG. 1) and/or the lattice constant of semiconductor strips 25. In some embodiments, epitaxy semiconductor regions 36 comprise silicon germanium (SiGe). In alternative embodiments, epitaxy semiconductor regions 36 comprise silicon carbon (SiC). Epitaxy semiconductor regions 36 may be formed using one of Chemical Vapor Deposition (CVD) methods. The precursors for forming germanium-containing epitaxy semiconductor regions 36 may include Si-containing gases and Ge-containing gases, such as $SiH_4$ and $GeH_4$, respectively, and the partial pressures of the Si-containing gases and Ge-containing gases are adjusted to modify the atomic ratio of germanium to silicon. In some embodiments, the atomic percentage of germanium in epitaxy semiconductor regions 36 is greater than about 20 atomic percent. Alternatively, epitaxy semiconductor regions 36 comprise SiC, with the atomic percentage of carbon being greater than three percent, for example. Epitaxy semiconductor regions 36 may form a guard ring along with fins 24 in accordance with embodiments. The guard ring formed of semiconductor regions 36 and fins 24 may be a full ring, with no break therein in accordance with some embodiments.

During the epitaxy for forming epitaxy semiconductor regions 36, p-type impurities such as boron or n-type impurities such as phosphorous may be doped with the proceeding of the epitaxy. For example, when epitaxy semiconductor regions 36 comprise SiGe, p-type impurities are doped. Otherwise, when epitaxy semiconductor regions 36 comprise SiC, n-type impurities are doped. The impurity concentration of the p-type or n-type impurity may be between about $1 \times 10^{19}/cm^3$ and about $1 \times 10^{21}/cm^3$. In alternative embodiments, no p-type and n-type impurity is in-situ doped. Instead, the impurities are doped into epitaxy semiconductor regions 36 through implantation after their formation.

Due to different growth rates on different surface planes, the growth of epitaxy semiconductor regions 36 comprises lateral growth and vertical growth. Facets are hence formed as being the surfaces of epitaxy semiconductor regions 36, as shown in FIG. 4. The epitaxy semiconductor regions 36 grown from neighboring recesses may be merged with each other to form a large epitaxy region.

After the formation of epitaxy semiconductor regions 36, silicide regions 38 (not shown in FIG. 4, refer to FIGS. 6B and 6C) may be formed on the top surfaces of epitaxy semiconductor regions 36. Next, referring to FIG. 5, metal contact plugs 40 are formed over and electrically connected to epitaxy semiconductor regions 36. Metal contact plugs 40 may be overlying and in contact with silicide regions 38, as shown in FIGS. 6B and 6C. Metal plugs 40 may have a longitudinal direction (the illustrated X direction in FIG. 5) perpendicular to the longitudinal direction (the illustrated Y direction) of original fins 24 (as in FIG. 1). Furthermore, metal contact plugs 40 may also include portions landing on STI regions 22.

Figure 5:
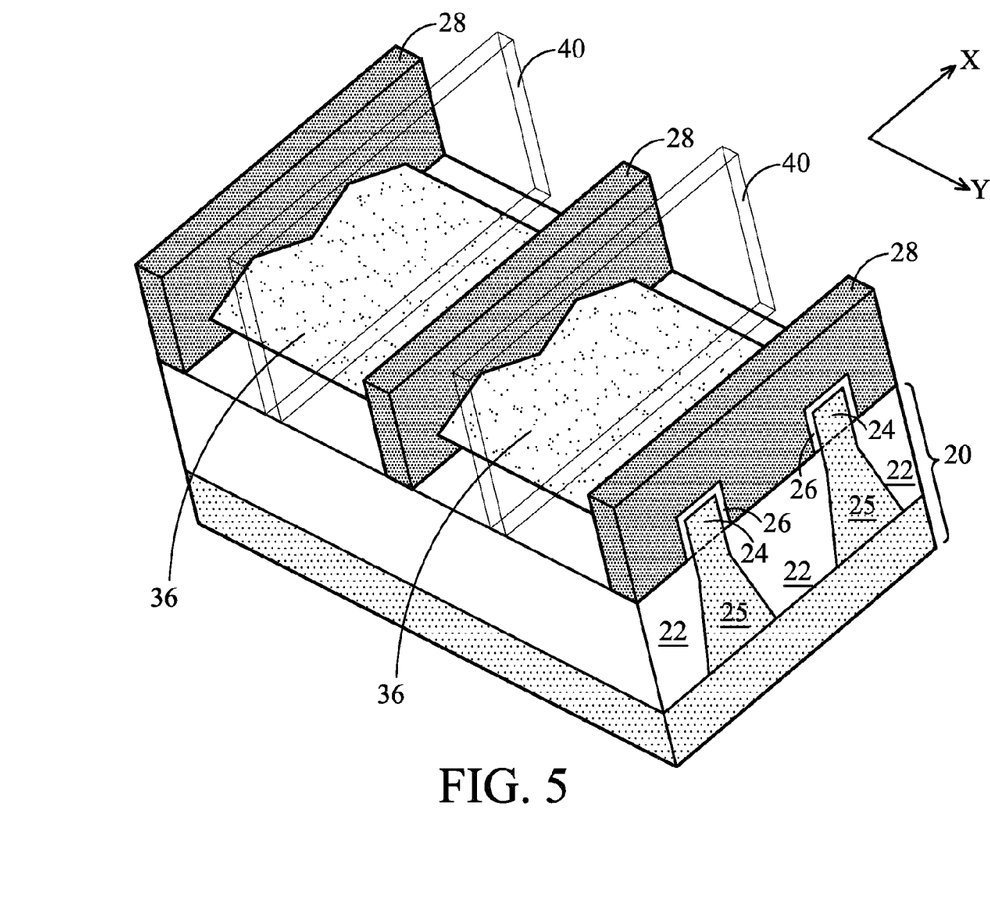

In some embodiments, gate electrodes 28 are left in the final Guard ring. In alternative embodiments, gate electrodes 28 may be removed, and replaced by metal gates, which metal gates are referred to as replacement gates. The process for forming the replacement gates may include forming a first Inter-Layer Dielectric (ILD) 42 (not shown in FIG. 5, shown in FIGS. 6B and 6C), removing gate electrodes 28 and the overlying hard masks (if any) to form recesses, depositing a metal to fill the resulting recesses left by the removed gate electrodes 28, and polishing the metal to form the replacement gates. Throughout the description, the replacement gates, if any, are also referred to as gate electrodes 28.

Figure 6A:
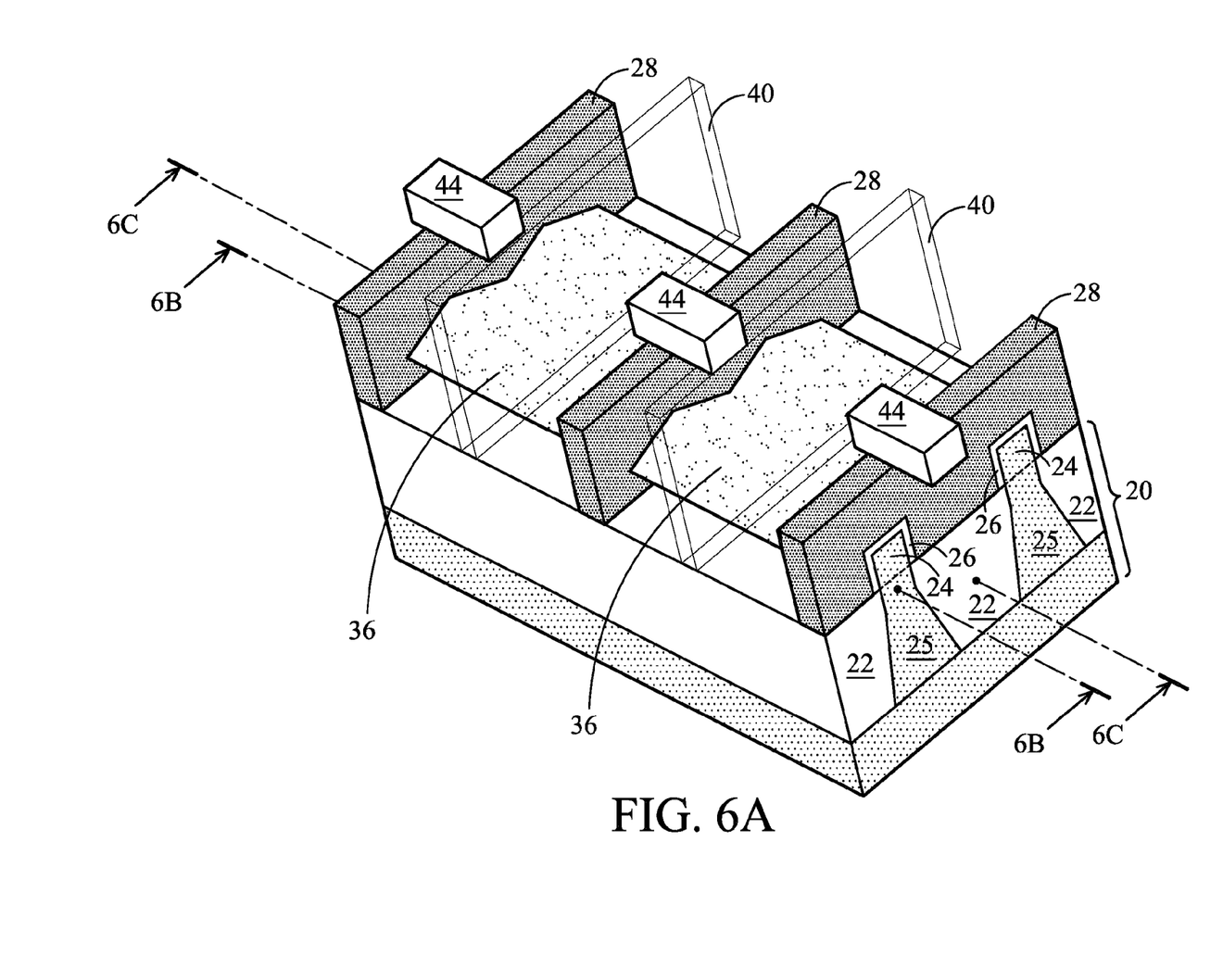
Figure 6B:
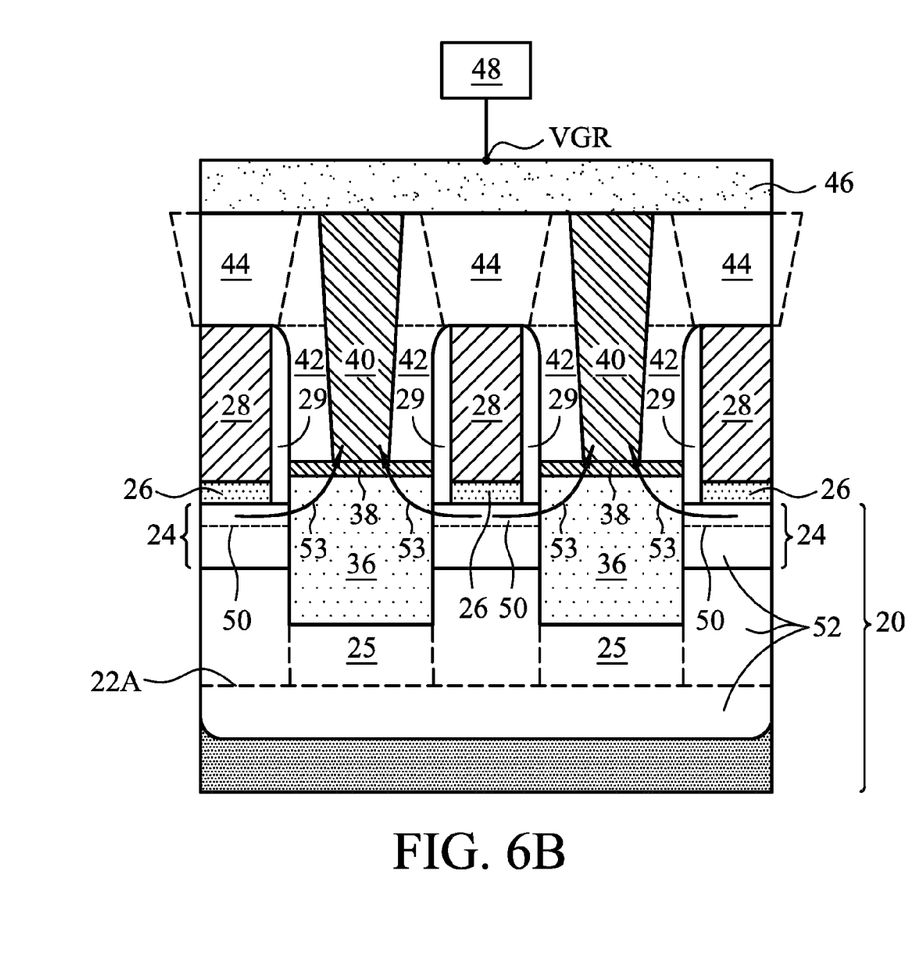
FIGS. 6B and 6C are cross-sectional views of the structure in FIG. 6A.
Figure 6C:
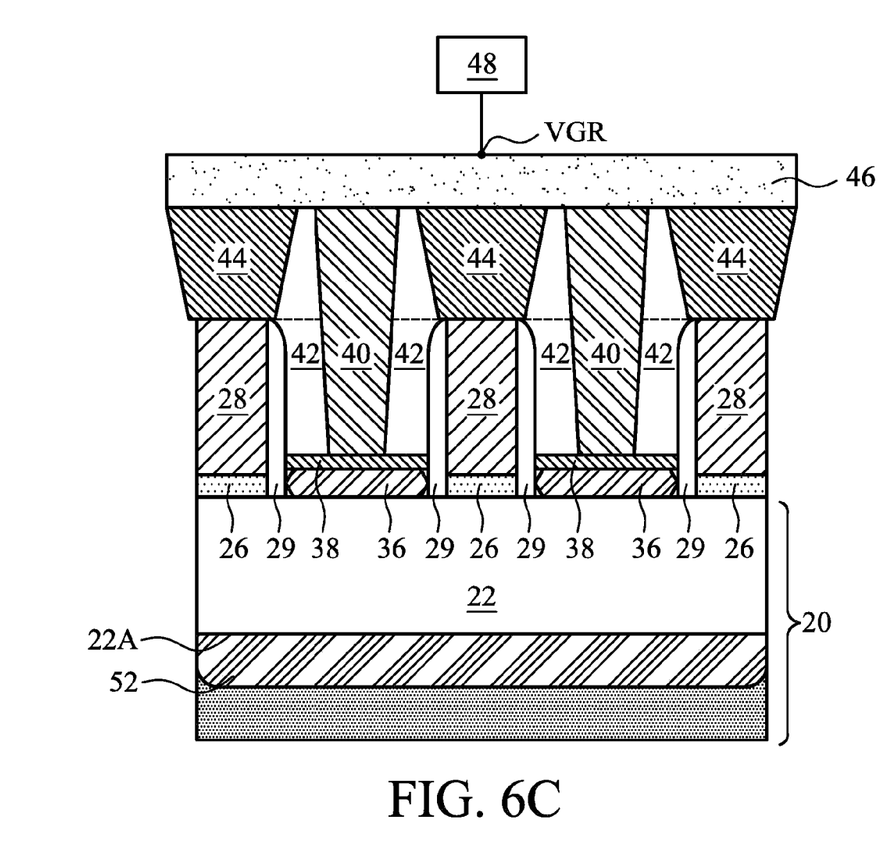

FIG. 6A illustrates the formation of contact plugs 44 over and electrically connected to gate electrodes 28. FIGS. 6B and 6C illustrate cross-sectional views of the structure in FIG. 6A, wherein the cross-sectional views are obtained from the vertical plane crossing lines 6B-6B and 6C-6C, respectively, in FIG. 6A. FIG. 6B illustrates the plane that crosses the remaining portions of semiconductor strips 25, wherein epitaxy semiconductor regions 36 are formed over and contacting semiconductor strips 25. The bottom surface of STI regions 22 (not in the plane of FIG. 6B, refer to FIGS. 6A and 6C) is marked as 22A. Contact plugs 40 are over and electrically connected to epitaxy semiconductor regions 36, and may be further connected to metal line 46. Metal line 46 may also be electrically coupled to gate electrodes 28 through gate contact plugs 44, which is illustrated using dashed lines since they are not in the plane of FIG. 6B. During the operation of the integrated circuits, voltage VGR is applied to metal line 46. Accordingly, epitaxy semiconductor regions 36 and gate electrodes 28 are applied with the same voltage VGR, which is generated by voltage source 48.

In some embodiments, epitaxy semiconductor regions 36 are doped with a p-type impurity, and may comprise silicon germanium. Accordingly, voltage VGR may be a negative voltage. Alternatively, voltage VGR is equal to VSS. Accordingly, holes are attracted to, and accumulated in regions 50, which are overlapped by, and contacting, gate dielectrics 26. Accordingly, regions 50 become p-type channels, in which holes (represented by arrows 53) may flow through. The regions underlying gate electrodes 28 are accordingly connected to voltage VGR, and hence forms a part of the resulting guard ring, as shown in FIG. 7. Furthermore, through p-type channels 50 in fins 24, the plurality of p-type epitaxy semiconductor regions 36 are interconnected to form a continuous guard ring. In these embodiments, well region 52 is formed as a p-well region, in which p-type epitaxy semiconductor regions 36 are located. P-type epitaxy semiconductor regions 36 are further in contact with p-well region 52, so that voltage VGR is also applied to p-well region 52.

In alternative embodiments, epitaxy semiconductor regions 36 are doped with an n-type impurity, and may comprise silicon carbon. Accordingly, voltage VGR may be a positive voltage, which may be power supply voltage VDD. Electrons are attracted to and accumulated in regions 50, which are overlapped by, and in contact with, gate dielectrics 26. Regions 50 become n-type channels, in which electrons (represented by arrows 53) may flow through. Therefore, the regions underlying gate electrodes 28 are also connected to voltage VGR, and hence forms a part of the resulting guard ring. Furthermore, through n-type channels 50 in fins 24, the plurality of n-type epitaxy semiconductor regions 36 are interconnected to form a continuous guard ring. In these embodiments, well region 52 is formed as an n-well region, in which n-type epitaxy semiconductor regions 36 are located. N-type epitaxy semiconductor regions 36 are further in contact with n-well region 52, so that voltage VGR may be applied to n-well region 52.

FIG. 6C illustrates that gate electrodes 28 and contact plugs 40 also overlap STI regions 22. Although gate dielectrics 26 are illustrated as extending between gate electrodes 28 and STI regions 22, gate dielectrics 26 may also not extend to the illustrated plane in alternative embodiments. The illustrated epitaxy semiconductor regions 36 are thin in the illustrated plane since they are formed by the lateral growth. As shown in FIG. 6C, voltage VGR may be applied on a plurality of gate electrodes 28 and a plurality of metal contacts 40, which are interconnected through metal line 46.

FIG. 7 illustrates a top view of guard ring 54 in accordance with embodiments. The structure shown in FIGS. 6A may be reproduced to include four portions that form the four sides of guard ring 54. As shown in FIG. 7, a plurality of contact plugs 40 is over and electrically coupled to epitaxy semiconductor regions 36, and a plurality of contact plugs 44 is over and electrically couple to gate electrodes 28. In some embodiments, all of gate electrodes 28 of guard ring 54 are interconnected, and/or applied with the same voltage. All of contact plugs 40 may be interconnected, and/or applied with the same voltage. Furthermore, all of gate electrodes 28 may be connected to all of contact plugs 40, and/or applied with the same voltage. Fins 24 (FIG. 6A) and epitaxy semiconductor regions 36 are interconnected to form one or a plurality of semiconductor rings, wherein fins 24 and epitaxy semiconductor regions 36 are allocated in an alternating pattern. The plurality of semiconductor rings may be full rings, although they may have breaks therein.

Guard ring 54 may encircle a region, which region may have a rectangular top-view shape or any other applicable shape. MOS devices 56 are formed in the region encircled by guard ring 54. In some embodiments, MOS devices 56 are FinFETs. Accordingly, the fins, the gate dielectrics, the gate electrodes, the source and the drain regions, and the like, of MOS devices 56 may be formed simultaneously when fins 24 (FIG. 1A), gate dielectrics 26 (FIG. 6A), gate electrodes 28, and epitaxy regions 36, respectively, are formed.

In the embodiments, by forming gate dielectrics 26 (FIG. 6A), gate electrodes 28, and gate spacers 29 to cover portions of fins 24 before the etching of fins 24 and the epitaxy of epitaxy semiconductor regions 36, the length D1 (FIG. 2) of each of discrete epitaxy semiconductor regions 36 is reduced. The growth of epitaxy semiconductor regions 36 thus has a better uniformity. This in turn results in the reduction in the non-uniformity of the guard ring and the reduction in the contact resistance of the guard ring.

In accordance with embodiments, a device includes a semiconductor substrate, isolation regions extending into the semiconductor substrate, a plurality of semiconductor fins higher than top surfaces of the isolation regions, and a plurality of gate stacks. Each of the gate stacks includes a gate dielectric on a top surface and sidewalls of one of the plurality of semiconductor fin, and a gate electrode over the gate dielectric. The device further includes a plurality of semiconductor regions, each disposed between and contacting two neighboring ones of the plurality of semiconductor fins. The device further includes a plurality of contact plugs, each overlying and electrically coupled to one of the plurality of semiconductor regions. An electrical connection electrically interconnects the plurality of semiconductor regions and the gate electrodes of the plurality of gate stacks.

In accordance with other embodiments, a device includes a semiconductor substrate, isolation regions extending into the semiconductor substrate, and a semiconductor ring encircling a portion of the semiconductor substrate. The semiconductor ring includes a plurality of semiconductor fins higher than a top surface of the isolation regions, and a plurality of epitaxy semiconductor regions contacting the plurality of semiconductor fins. The plurality of epitaxy semiconductor regions and the plurality of semiconductor fins are allocated in an alternating pattern. The device further includes a plurality of gate dielectrics, each on a top surface and sidewalls of one of the plurality of semiconductor fins, and a plurality of gate electrodes, each overlying one of the plurality of gate dielectrics. A plurality of contact plugs is formed, with each being overlying and electrically coupled to one of the plurality of epitaxy semiconductor regions.

In accordance with yet other embodiments, a method includes forming a gate stack over a semiconductor fin, wherein the semiconductor fin forms a ring. A portion of the semiconductor fin not covered by the gate stack is etched to form a recess. The method further includes performing an epitaxy to grow an epitaxy semiconductor region from the recess, forming a first contact plug overlying and electrically coupled to the epitaxy semiconductor region, and forming a second contact plug overlying and electrically coupled to the gate stack.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a semiconductor fin, wherein the semiconductor fin forms a ring;
   forming a plurality of gate stacks on sidewalls and a top surface of each of sides of the ring;
   epitaxially growing a plurality of epitaxy regions between the plurality of gate stacks; and
   forming a plurality of metal contact plugs, each being over, and electrically coupling to, one of the plurality of epitaxy regions.

2. The method of claim 1 further comprising:
   doping the plurality of epitaxy regions with a p-type impurity; and
   forming connections electrically connecting the plurality of epitaxy regions to a voltage source, wherein the voltage source is configured to provide a VSS voltage to the plurality of epitaxy regions.

3. The method of claim 1 further comprising:
   doping the plurality of epitaxy regions with a p-type impurity; and
   forming electrical connections electrically connecting the plurality of epitaxy regions to a voltage source, wherein the voltage source is configured to provide a negative voltage to the plurality of epitaxy regions.

4. The method of claim 1 further comprising:
   doping the plurality of epitaxy regions with an n-type impurity; and
   forming electrical connections electrically connecting the plurality of epitaxy regions to a voltage source, wherein the voltage source is configured to provide a positive voltage to the plurality of epitaxy regions.

5. The method of claim 4, wherein the voltage source is configured to provide a VDD voltage to the plurality of epitaxy regions.

6. The method of claim 1 further comprising forming conductive features to electrically couple gate electrodes of the plurality of gate stacks to the plurality of metal contact plugs.

7. The method of claim 1, wherein the plurality of epitaxy regions and the plurality of epitaxy regions of the semiconductor fin underlying the plurality of gate stacks in combination form a full ring.

8. The method of claim 1 further comprising forming a Metal-Oxide-Semiconductor (MOS) device in a region encircled by the ring.

9. A method comprising:
forming a semiconductor fin, wherein the semiconductor fin forms a ring;
forming a plurality of gate stacks on sidewalls and a top surface of each of sides of the ring;
etching portions of the ring between the plurality of gate stacks to form recesses;
epitaxially growing a plurality of epitaxy regions between the plurality of gate stacks, wherein the plurality of epitaxy regions are grown from the recesses, and wherein the plurality of epitaxy regions and additional portions overlapped by the plurality of gate stacks in combination form an additional ring; and
forming a plurality of metal contact plugs, each being over, and electrically coupling to, one of the plurality of epitaxy regions.

10. The method of claim 9 further comprising electrically shorting the plurality of epitaxy regions and the plurality of gate stacks.

11. The method of claim 9, wherein the plurality of epitaxy regions is of p-type, and the method further comprises:
forming electrical connections electrically connecting the plurality of epitaxy regions to a voltage source, wherein the voltage source is configured to provide a VSS voltage or an negative voltage to the plurality of epitaxy regions.

12. The method of claim 9, wherein the plurality of epitaxy regions is of n-type, and the method further comprises:
forming electrical connections electrically connecting the plurality of epitaxy regions to a voltage source, wherein the voltage source is configured to provide a positive voltage to the plurality of epitaxy regions, wherein the voltage source is configured to provide a VDD voltage to the plurality of epitaxy regions.

13. The method of claim 9 further comprising forming conductive features to electrically couple gate electrodes of the plurality of gate stacks to the plurality of metal contact plugs.

14. The method of claim 9, wherein the plurality of epitaxy regions and portions of the semiconductor fin directly underlying the plurality of gate stacks in combination form a full ring.

15. The method of claim 9 further comprising forming a Metal-Oxide-Semiconductor (MOS) device in a region encircled by the ring.

16. A method comprising:
forming a plurality of gate stacks on sidewalls and a top surface of each of sides of a semiconductor fin, wherein the semiconductor fin forms a full ring;
etching portions of the full ring between the plurality of gate stacks to form recesses;
epitaxially growing a plurality of epitaxy regions in the recesses;
forming a first plurality of metal contact plugs, each being over, and electrically coupling to, one of the plurality of epitaxy regions;
forming a second plurality of metal contact plugs, each being over, and electrically coupling to, one of the plurality of gate stacks; and
electrically shorting the first plurality of metal contact plugs and the second plurality of metal contact plugs with each other.

17. The method of claim 16 further comprising electrically connecting the first plurality of metal contact plugs and the second plurality of metal contact plugs to a VDD voltage or a VSS voltage.

18. The method of claim 16 further comprising forming a Metal-Oxide-Semiconductor (MOS) device in a region encircled by the full ring.

19. The method of claim 16, wherein the electrically shorting the first plurality of metal contact plugs and the second plurality of metal contact plugs comprises forming a common metal line over and in contact with the first plurality of metal contact plugs and the second plurality of metal contact plugs.

20. The method of claim 16, wherein the plurality of gate stacks is formed periodically on the full ring.

* * * * *